United States Patent [19]
Strid et al.

[11] Patent Number: 5,561,377
[45] Date of Patent: Oct. 1, 1996

[54] SYSTEM FOR EVALUATING PROBING NETWORKS

[75] Inventors: Eric W. Strid; Jerry B. Schappacher; Dale E. Carlton; K. Reed Gleason, all of Portland, Oreg.

[73] Assignee: Cascade Microtech, Inc., Beaverton, Oreg.

[21] Appl. No.: 422,439

[22] Filed: Apr. 14, 1995

[51] Int. Cl.⁶ .................................................... G01R 31/02
[52] U.S. Cl. .......................................... 324/754; 324/73.1
[58] Field of Search ............................... 324/158.1, 73.1, 324/750, 757, 761, 765, 72.5, 754; 439/482; 333/246, 248

[56] References Cited

U.S. PATENT DOCUMENTS

| | | |
|---|---|---|
| 4,566,184 | 1/1986 | Higgins et al. . |
| 4,827,211 | 5/1989 | Strid et al. . |
| 4,918,374 | 4/1990 | Stewart et al. . |
| 4,994,737 | 2/1991 | Carlton et al. . |
| 5,065,092 | 11/1991 | Sigler . |
| 5,070,297 | 12/1991 | Kwon et al. . |
| 5,144,228 | 9/1992 | Soma et al. . |
| 5,198,756 | 3/1993 | Jenkins et al. . |

FOREIGN PATENT DOCUMENTS 2197081   5/1988   United Kingdom .

OTHER PUBLICATIONS

"CHECKPOINT™," product literature sheets (2 pages) for a probe card analyzer made by Applied Precision of Mercer Island, Washington (undated but prior to Apr. 14, 1995).

"PROBILT PB500A™ Probe Card Repair and Analysis Station," product brochure (4 pages) for a probe card analyzer made by Integrated Technology Corporation of Tempe, Arizona (undated but prior to Apr. 14, 1995).

J. D. Tompkins, "Evaluating High Speed AC Testers," IBM Technical Disclosure Bulletin, vol. 13, No. 7, Dec. 1970, pp. 1807–1808.

*Primary Examiner*—Vinh P. Nguyen
*Attorney, Agent, or Firm*—Chernoff, Vilhauer, McClung & Stenzel

[57] ABSTRACT

An interconnect assembly for evaluating a probe measurement network includes a base, respective inner and outer probing areas in mutually coplanar relationship on the upper face of the base, a reference junction, and a high-frequency transmission structure connecting the probing areas and the reference junction so that high-frequency signals can be uniformly transferred therebetween despite, for example, variable positioning of the device-probing ends of the network on the probing areas. A preferred method for evaluating the signal channels of the network includes connecting a reference unit to the reference junction and successively positioning each device-probing end that corresponds to a signal channel of interest on the inner probing area. Because the transmission structure uniformly transfers signals, the relative condition of the signals as they enter or leave each end will substantially match the condition of the signals as measured or presented by the reference unit, thereby enabling calibration of the network in reference to the device-probing ends. The assembly is particularly well-adapted for the evaluation of probe measurement networks of the type used for testing planar microelectronic devices.

12 Claims, 8 Drawing Sheets

SYSTEM FOR EVALUATING PROBING NETWORKS

BACKGROUND OF THE INVENTION

The present invention relates to a system for high-frequency evaluation of probe measurement networks and, in particular, to a system for accurately evaluating the signal conditions existing in such networks even in those ones of such networks, for example, that are of a multichannel type in which each channel communicates through a separate device-probing end and even in those ones of such multichannel networks, for example, that have their device-probing ends crowded together in a high-density coplanar probing array as suitable for the measurement of integrated circuits or other microelectronic devices.

FIG. 1 shows a probe station 20 that includes a multichannel measurement network 21 of a type suitable for measuring high-frequency microelectronic devices at the wafer level. A probe station of this type is manufactured, for example, by Cascade Microtech, Inc. of Beaverton, Oreg. and sold under the trade name SUMMIT 10000. The various devices 24, the characteristics of which are to be measured by the network, are formed on the surface of a wafer 22 in isolation from each other. An enlarged schematic plan view of an individual device 24 is shown in FIG. 2. The surface of each device includes a predetermined pattern of bonding pads 26 that provide points of connection to the respective electrical components (not shown) formed on the central area of each device. The size of each bonding pad is exaggerated for ease of illustration in FIG. 2, but it will be recognized by one of ordinary skill in the art that there will typically be hundreds of bonding pads in the rectangular arrangement shown, each of a size that is barely visible to the eye without magnification. If a hybrid device instead of a flat wafer is being tested, then the individual devices can rise to different heights above the plane of the hybrid device's upper surface.

As depicted in FIG. 1, to facilitate high-frequency measurement of each device 24, a typical probe station 20 includes a wafer-receiving table or chuck 28 for supporting the wafer 22. The probe measurement network 21 of the station includes a probing assembly 30 which, as shown, can take the form of a probe card with a multiconductor probe tip array for delivering signals to, and receiving signals from, the respective bonding pads of each individual device. One common type of probe card structure, as depicted, includes an open-centered rectangular-shaped frame 32 with numerous needle-like probe tips 34 that downwardly converge toward the open center of the frame. The end portion of each tip is bent at a predetermined angle so that the lower extremities or device-probing ends of the tips, which typically have been blunted by lapping to form a coplanar array, are suitably arranged for one-to-one contact with the bonding pads 26 provided on each respective microelectronic device. The measurement signals provided by the network are generated within and monitored by a multichannel test instrument 36, which is connected to the probe card via a suitable multiconductor cable 38. The probe station also includes an X-Y-Z positioner (e.g., controlled by three separate micrometer knobs 40a, b, c) for permitting fine adjustments in the relative positions of the probe card 30 and the selected device-under-test.

The individual elements that make up a probe measurement network can take forms other than those shown in FIG. 1. For example, depending on the particular requirements of the devices to be measured, the probing assembly can take the form of a multiconductor coplanar waveguide as shown in Strid et al. U.S. Pat. No. 4,827,211 or Eddison et al. UK Patent No. 2,197,081. Alternatively, the assembly can take the form of an encapsulated-tip probe card as shown in Higgins et al. U.S. Pat. No. 4,566,184, or a multiplane probe card as shown in Sorna et al. U.S. Pat. No. 5,144,228, or a dual-function probe card in which the probe card not only probes but also supports the downturned wafer, as shown in Kwon et al. U.S. Pat. No. 5,070,297. Use of this last card structure, however, is limited to the probing of flat wafers or other device configurations in which all devices are of the same height.

Before using a probing station or other probing system to measure the high-frequency performance of individual devices, such as those formed on a wafer, it is desirable to first accurately evaluate the signal conditions that are actually present in the measurement network of the system with reference, in particular, to the device-probing ends of the network.

For example, with respect to a probing system of the type shown in FIG. 1, in order to accurately calibrate the source or incoming channels of the system's measurement network, preferably measurements are made of the respective signals that are generated by the various sourcing units of the test instrument 36 in order to reveal how these signals actually appear in relation to each other when they arrive at the device-probing ends that correspond to the respective source channels, since the signals that actually enter the input pads of each device come directly from these ends. Conversely, in order to accurately calibrate the sense or outgoing channels of the probing network, preferably the respective signal conditions that are indicated by the various sensing units of the test instrument 36 are observed when reference signals of identical or otherwise relatively known condition are conveyed to the device-probing ends that correspond to the respective sense channels, since the signals that actually exit the output pads of each device go directly to these ends. Should any channel-to-channel differences be found to exist in the network, these differences can be compensated for so that the test instrument will only respond to those differences which actually arise from the different input/output characteristics of the device-under-test.

Typically it is difficult, however, to make comparatively accurate high-frequency measurements in reference to the extreme ends of a probing assembly where the ends have been arranged for the measurement of planar microelectronic devices because of the reduced size and the closely crowded arrangement of such ends. This is particularly so when the probing assembly is of the card-like type 30 shown in FIG. 1, due to the inherent fragility of the needle-like tips 34 that are part of such an assembly.

The reason for this difficulty can be better understood in reference to FIG. 3, which shows one common type of interconnect assembly that has been used to evaluate probe measurement systems of the type shown in FIG. 1. This assembly includes a signal probe 42 having a single pointed transmission end 44, which probe is connected, via a cable, to the sensing unit, for example, of a test instrument. This instrument can either be the same as that instrument 36 which provides the sourcing units for the probe measurement network or, as shown, can be an entirely separate instrument 46. Viewing FIGS. 1 and 3 together, when the pointed end of the signal probe is being repositioned from one tip 34 to another, normally it is necessary to move the relatively stiff end of the probe slowly and deliberately in order to avoid damaging the delicate needle-like tips, so that a relatively long period of time is needed in order to complete evaluation in relation to all the tips. Additionally, this type of probe has poor high-frequency measurement stability in moderately noisy test environments. Even more significantly, because the extreme ends of the needle-like tips 34 on the probe card are too thin and delicate to be probed directly, probe-to-probe contact between the pointed transmission end 44 of the signal probe and each needle-like tip of the probe card must occur further up nearer to the base of each tip. This introduces, for example, a phase offset of indeterminate amount between the signal that is being measured by the signal probe and the signal as it will actually appear in relation to the bonding pads 26 (FIG. 2) of each device. The degree of this offset, moreover, will generally vary in an arbitrary manner between the different tips, since the pointed end of the probe will normally be placed into contact with the different tips at somewhat different positions along their respective lengths. Using this type of calibration assembly, then, it is difficult, if not impossible, to accurately evaluate the relationships of the different signals that actually exit the various device-probing ends of the needle-like tips 34 and hence it is difficult, if not impossible, to normalize these signals or to otherwise calibrate the network so as to permit accurate device measurement.

An alternative approach to probe network evaluation would be to use one or more of the device-probing ends that are included on the probe card itself, instead of a separate signal probe, for establishing the reference channel back to the original test instrument. In accordance with this approach, a different form of interconnect assembly would be used. This assembly might include a plurality of conductive paths, such as those defined by traces formed on a substrate, where the arrangement of the paths would be such that each device-probing end relative to which evaluation is to be conducted would be connected to one of the ends being used to establish the reference channel via a "through" channel formed by one or more of the paths.

However, through channels of this type would constitute less than perfect transmission lines and, to the extent that the majority of the ends are to be evaluated in this manner, these through channels would need to be of different lengths to accommodate such measurement. Hence, even when the same source or sense channel is being evaluated under this approach, the measured value of signal condition in the channel will appear to change depending on which through channel of the assembly is being used for making the observation. Moreover, since a typical probe card for wafer-level testing has hundreds of probe ends converging within an area less than one-half inch on each side, and since there can be cross-coupling of signals between closely adjacent paths as well as distortion caused by the presence of extraneous radiation in the measurement environment, a suitable physical layout that could provide, for example, adequate high-frequency signal isolation for each path is not readily apparent.

Although its use is limited to a probe card of quite different type than that shown in FIG. 1, another type of high-speed interconnect assembly which uses a signal probe for evaluating probing networks is described in J. Tompkins, "Evaluating High Speed AC Testers," *IBM Technical Disclosure Bulletin*, Vol. 13, No. 7, pp 1807–1808 (Dec. 1970). As in Kwon et al., in Tompkins it is the probe card itself that provides support for the device-under-test, that is, the device is turned over so that its bonding pads rest upon a plurality of slightly-raised rounded probing ends included on the upper side of the card. As in Kwon et al., this mounting method forecloses the testing of hybrid devices in which components of different height are mounted on the face of the device. An additional disadvantage of the Tompkin's probing network is the poorly regulated interconductor spacing in the lead-in cable to the card, which can result in signal instability at higher frequencies. In any event, to evaluate the signals that are present in the network in reference to the rounded probing ends on the card, the interconnect assembly of Tompkins includes a two-prong signal probe together with a sheet-like dielectric member which is placed in a predefined position over the device-supporting or upper side of the probe card. Uniformly-spaced holes are formed through the dielectric member and serve as guide channels for guiding the first prong of the signal probe into tip-to-tip contact with the various rounded probing ends on the card. At the same time, a shorter second prong of the signal probe automatically establishes contact with a conductive ground plane which is formed on the upper side of the dielectric member and which surrounds each hole on that member.

There are significant difficulties with the type of evaluation approach just described, however, because the pointed end formed on the first prong of the signal probe can, over time, wear down the rounded ends of the probe card so that these rounded-ends eventually lose their capacity to establish simultaneous electrical contact with the planar pads of the device-under-test. Furthermore, this measurement approach does not permit, while device testing is in progress, quick evaluation of signal condition with respect to a particular probing end of the card, because the first prong of the probe normally cannot be applied to any of the ends of the card until after the device has been carefully lifted off the card and removed to a safe static-free location.

Another approach to evaluating the measurement network of a probing system employs an impedance standard substrate of the type described, for example, in Carlton, et al., U.S. Pat. No. 4,994,737. An impedance standard substrate comprises a substrate on which there are known impedance standards, which standards are suitably configured for simultaneous probing by the device-probing ends of the network. The standards can include, for example, an open circuit transmission line element formed by a pair of spaced-apart pads. Unlike the evaluation methods thus far described, no separate reference channel is provided to receive each signal as each signal exits the tip end of a respective incoming channel. Instead, the impedance standard on the substrate is used for reflecting the incoming signal so that the signal is transformed at the tip to an outgoing signal which then travels back to the test instrument through its original signal channel. The electrical characteristics of the corresponding signal channel can then be analyzed from measurements taken at the test instrument using time-domain reflectometry.

However, in a multichannel network, the differences which exist between the incoming signals at the device-probing ends of the various incoming channels are a function not only of the differences which exist in the respective circuit characteristics of those channels (i.e., the differences in the relative conditions for the signals) but are also a function of the-differences which exist in the signals themselves from the moment that each is first generated within a respective sourcing unit of the test instrument (i.e., the differences in the respective conditions of the signals). Because the type of evaluation that is made with an impedance standard substrate only detects differences of the former sort and not of the latter, this type of approach, at least by itself, cannot be used to fully evaluate the differences in the incoming signals in reference to the device-probing ends of the measurement network. Conversely, the differences in the signal conditions that are indicated by the various sensing units of the test instrument, even when reference outgoing signals of identical condition are presented to the device-probing ends of the corresponding sense channels, are not observable using the impedance standard substrate approach. Thus, this approach does not permit the different signal conditions of a multichannel probe measurement network to be fully characterized and compensated for so as to allow accurate device measurement. It may also be noted that expensive processing is normally needed in order to properly evaluate time-domain reflectometry measurements, because the signal which is evaluated in these types of measurements is prone to significant cumulative distortion due to partial reflections occurring along the channel, conductor losses, frequency dispersion and so on.

One type of probe card evaluation system which is unsuitable for high-frequency measurements but which can be used in relation to an array of probe tips for measuring certain low frequency or DC characteristics is sold by Applied Precision, Inc., of Mercer Island, Wash., under the trade name CHECKPOINT™. The design of this system is patented in Stewart et al., U.S. Pat. No. 4,918,374, and a similar system is apparently made by Integrated Technology Corporation of Tempe, Ariz. under the trade name PROBILT PB500A™. As described in Stewart, the evaluating system has its own probe card holder. The probe card is transferred to this holder so that the probe card can be held in a predetermined position above a square-shaped checkplate, the upper side of which is divided into four quadrants. In one characteristic construction, at least one of the quadrants contains a narrow conductive strip extending in either an X or Y reference direction. To determine the X position of a particular tip, for example, the Y directional strip is moved by incremental movements of the underlying checkplate in the X direction toward the tip until a continuity reading between the Y directional strip and the tip reveals the precise X position of that tip relative to the checkplate's original position and hence relative to the card. In order to determine the positions of several tips at the same time, in a second construction, one of the quadrants contains a number of spaced-apart parallel strips that are each wired out to a separate terminal on the sides of the checkplate, thereby making it possible to discern, for purposes of positional verification, which strip is in contact with which tip.

In order to determine the respective positions of two tips that have been electrically tied together at some point up from their ends, yet a third construction is used in Stewart, since under the first two constructions there can apparently be some difficulty in determining visually which particular tip of the two that are tied together is actually in contact with a strip when continuity is detected. In this third construction, one of the quadrants contains a solitary conductive dot of sufficient smallness that only one probe tip at a time can be placed on the dot, thereby enabling the position of each tip to be determined in consecutive sequence. In order to get a proper continuity reading, any other conductor on the checkplate besides the dot is confined to another quadrant of the checkplate. Hence, any other tip that might be tied to the tip under test, including a tip on the opposite side of the card, cannot come into contact with another conductor as the tip under test approaches the dot, which would confusingly produce the same reading as if the tip under test had achieved contact with the dot. For apparently similar reasons, the conductive dot is wired out to a terminal that is separate from the terminal of any conductor in the other quadrants.

From the foregoing description of the Stewart evaluation system, it will be recognized that the principal use of this system is to precisely locate the relative positions of the device-probing ends of the measurement network. Although it might be possible to upgrade the Stewart system to permit the evaluation of certain lower frequency characteristics (such as by adding, perhaps, a lumped capacitor divider network to the Stewart system to measure low-frequency capacitive effects), its structure is wholly inadequate for higher frequency measurements, such as those ranging above 50 MHz.

For example, to the extent that the conductor arrangement in Stewart assumes the form of several parallel strips in closely spaced relationship to each other, if the signal condition in any channel is evaluated via one of these strips, it can appear to vary depending on which strip is used (given that the electrical length between each strip and its corresponding terminal varies from strip-to-strip), on where exactly the device-probing end of the channel is placed in relation to the elongate strip, and on what types of distorting signals are present in the immediate vicinity of the device-probing end (since relatively unrestricted coupling of signals can occur between the closely neighboring strips). Similarly, to the extent that the conductor arrangement in Stewart takes the form of a solitar dot in any one quadrant, if the signal condition in any channel is evaluated via this dot, it may appear to vary due to coupling between tips and due to any movement of equipment in the vicinity of the channel, particularly since this type of conductor arrangement fails to provide adequate constraint of signal ground. That is, the one or more device-probing ends of the network that normally establish a ground return path for the high-frequency signal channels of the network by their connection, for example, with the ground pad or pads of the device under measurement, are afforded no connection sites in the quadrant of the Stewart checkplate containing the solitary dot. For the same reason, the Stewart system is not able to accurately duplicate during the evaluation session the loading conditions that are present during device measurement.

There are additional disadvantages associated with the Stewart procedure insofar as the probe card is removed in Stewart from its original holder and remounted in a separate stand-alone station before evaluation of the probe card begins. Although this remounting procedure allows the Stewart evaluation station to process the signals before they enter the checkplate, such procedure forecloses the possibility of in situ measurement of the network.

Other systems that have been developed for precisely locating the relative position of the device-probing ends of a measurement network are shown in Sigler, U.S. Pat. No. 5,065,092 and in Jenkins et al., U.S. Pat. No. 5,198,756. These systems, like that of Stewart, are inadequate for high-frequency measurement for similar reasons.

In accordance with the foregoing, then, an object of the present invention is to provide an improved system for evaluating the high-frequency characteristics of a probe measurement network with reference, in particular, to the device-probing ends of such network.

A related object of the present invention is to provide an improved interconnect assembly for uniformly transferring high-frequency signals to and from the device-probing ends of a probe measurement network, particularly when such ends are arranged for the measurement of planar microelectronic devices.

SUMMARY OF THE PRESENT INVENTION

The present invention solves the foregoing difficulties by providing an improved assembly and method for evaluating the signal conditions in a probe measurement network.

In a first aspect of the invention, an improved assembly is provided for use in evaluating network signal conditions. The assembly includes a base on the upper face of which are located respective first and second conductive planar probing areas. These areas are in spaced-apart mutually coplanar relationship to each other and are so arranged that a first and second device probing end of the probe network can be simultaneously placed on the first and second conductive planar probing areas, respectively. The improved assembly further includes a reference junction and a high-frequency transmission structure connecting the first and second probing areas to the reference junction such that for each position that the ends can occupy while on the corresponding areas, a transmission line of substantially constant high-frequency transmission characteristic is provided between these ends and the reference junction.

In accordance with the foregoing combination, there will be a substantially uniform relationship between the entering condition and the exiting condition of each high-frequency signal that is transmitted between the device-probing ends and the reference junction regardless of which probing position on the areas is occupied by the ends during each transmission. Hence, if a reference sensing unit, for example, is connected to the reference junction and the exiting condition of each signal is the same as measured at the reference sensing unit, then this confirms that the entering condition of each signal transferred to the areas by the ends was likewise the same, irrespective of the probing position used for each measurement. Conversely, if a reference sourcing unit is connected to the reference junction, so that the entering condition of each signal is the same, then the exiting condition of each signal that is transferred to the ends by the areas will likewise be the same irrespective of the probing position used during each transfer.

In accordance with a second aspect of the present invention, an improved method is provided for evaluating the signal conditions in a probe measurement network of the type having a plurality of separate measurement channels, where each channel communicates through a corresponding device-probing end. The method includes providing an assembly which includes a conductive planar probing area on the upper face of a base and a reference junction connected to the probing area by a high-frequency transmission structure. The method further includes placing the respective device-probing end of a first one of the measurement channels into contact with the planar probing area, transmitting a high-frequency signal through both the measurement channel and the reference junction and, thereafter, measuring the signal. This step is repeated for the other measurement channels and the signal conditions in the different channels are then evaluated by comparing the measured signals, where such evaluation is facilitated by maintaining, via the high-frequency transmission structure, a transmission line of substantially constant high-frequency transmission characteristic between each device-probing end coming into contact with the planar probing area and the reference junction.

In accordance with the above method, high-frequency signals can be uniformly transferred from the device-probing ends to a reference sensing unit connected to the reference junction, thereby enabling accurate calibration of the incoming or source channels of the network. Conversely, high-frequency signals can be uniformly transferred to the device-probing ends from a reference sourcing unit connected to the reference junction, thereby enabling accurate calibration of the outgoing or sense channels of the network.

The foregoing and other objectives, features, and advantages of the invention will be more readily understood upon consideration of the following detailed description of the invention, taken in conjunction with the accompanying drawings.

DETAILED DESCRIPTION OF THE PREFERRED EMBODIMENTS

Figure 4:
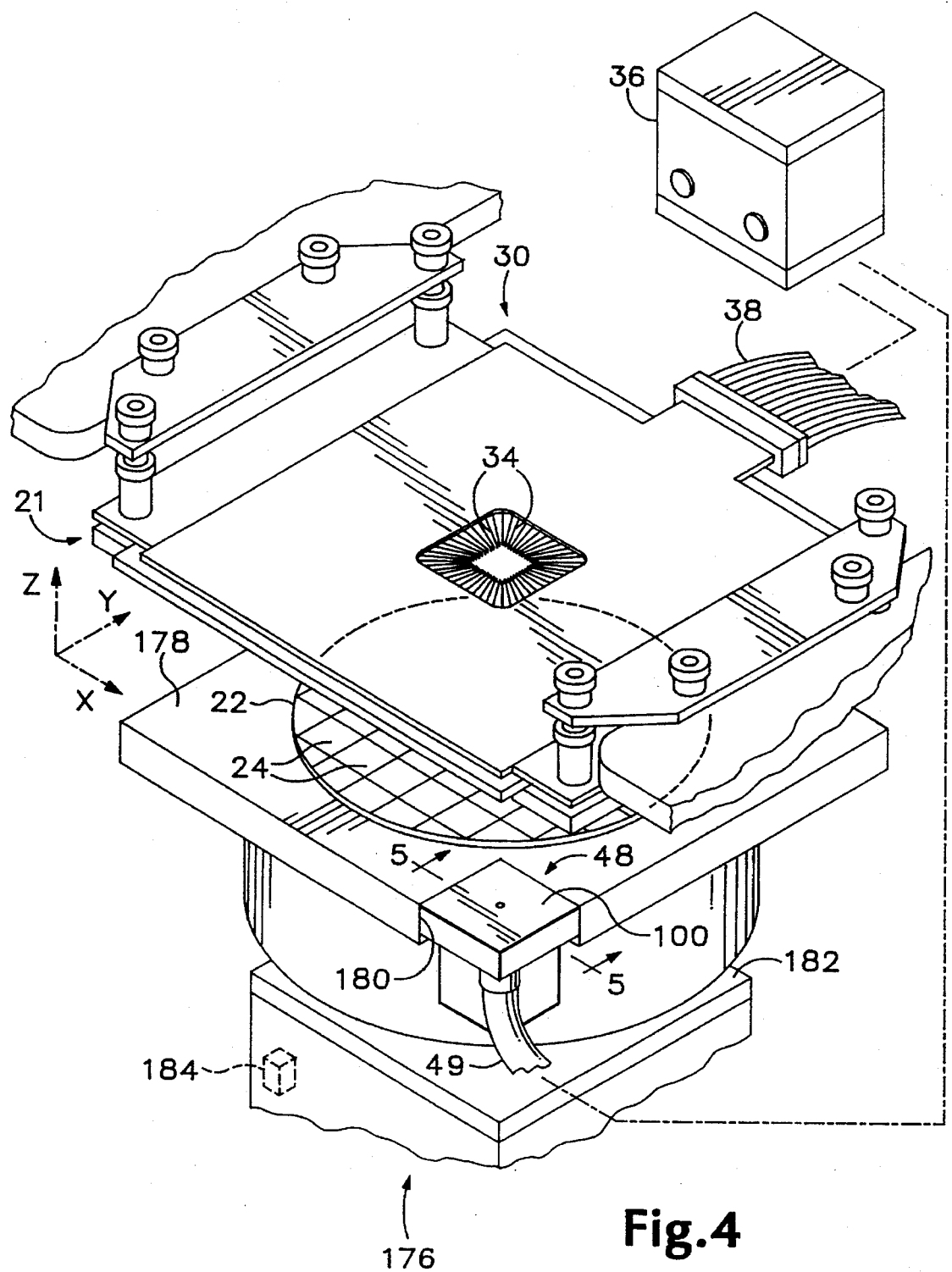
FIG. 4 is a perspective view of an exemplary interconnect assembly, constructed in accordance with the present invention, which assembly is integrated with a probe station, also shown, for enabling rapid and accurate calibration of the station's measurement network.

FIG. 4 shows an exemplary interconnect assembly 48 which is constructed in accordance with the present invention and which, in accordance with a preferred method, enables accurate calibration of a multichannel probe network 21. The network can include, as shown, a probe card 30 of the type having a plurality of needle-like probe tips 34, where the lower extremities of these tips form the device-probing ends of the network and these ends are so arranged as to match the pad arrangement of a specified group of microelectronic devices 24, such as those formed on an integrated wafer 22. The assembly 48, in particular, is so configured as to enable the uniform transfer of high-frequency signals between each different end and a reference sourcing or sensing unit despite the fragility of the needle-like probe tips 34 and the closely crowded arrangement of the device-probing ends.

In the exemplary embodiment shown, the reference sourcing or sensing unit will be understood to be detachably connected to the underside of the assembly 48 by a high-frequency channel, such as a coaxial cable 49. This reference unit can be provided by the same test instrument 36 which, with its different sourcing and sensing units, generates and monitors the various signals that are present in the network 21, that is, the signals which are transferred to and from each device 24 during device measurement. In the particular setup shown in FIG. 4, then, the probe measurement network 21 includes, in addition to the probe card 30, various sources and sensing units within the test instrument as well as the multiconductor measurement cable 38 that connects the card and instrument.

Figure 7:
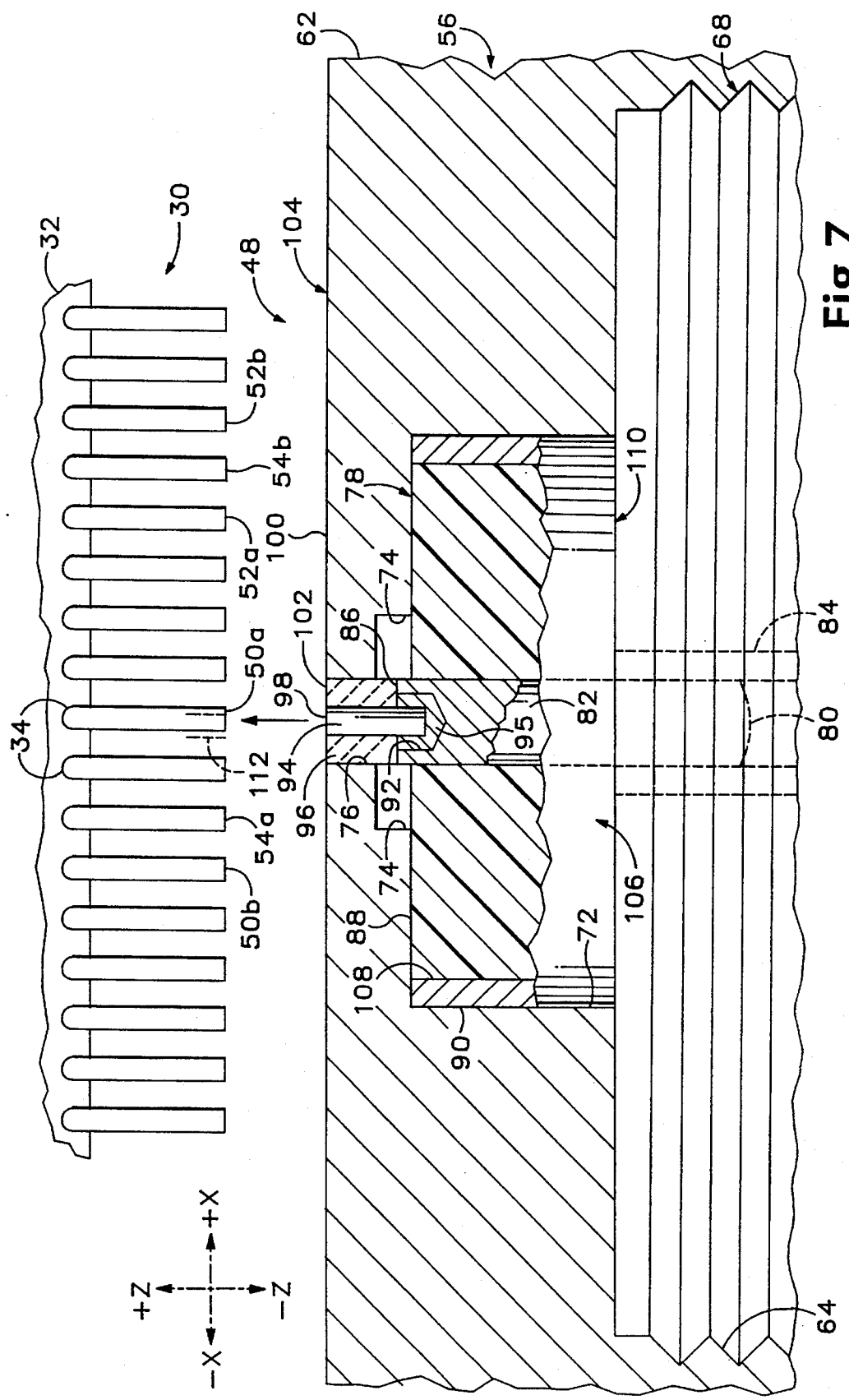
FIG. 7 is an enlarged sectional view of the exemplary interconnect assembly, as taken within the dashed-line region indicated by reference number 60 in FIG. 5, together with an enlarged elevational view of certain of the device-probing ends of the probe card of FIG. 4 so as to indicate the arrangement of these ends relative to the probing areas of the assembly.

FIG. 7 shows an enlarged elevational view of certain ones of the needle-like probe tips 34 which are included on the probe card 30 shown in FIG. 4. During device measurement, the device-probing ends of these tips, such as 50*a–b*, 52*a–b* and 54*a–b*, are used to transfer high-frequency signals to or from the device-under-test. These high-frequency signals are typically within the range of 100 MHz to 2 GHz. However, the term "high-frequency" is more broadly intended, herein and in the claims, to denote any frequency within the range from 50 MHz to 65 GHz or above.

For the sake of convenience, it will be assumed that any device-probing end which is identified in the drawings by a reference number starting with 50, such as ends 50*a* and 50*b*, corresponds to a source channel of the probe measurement network 21, that is, from each such end the incoming signal from a respective sourcing unit in the network 21 is directly transferred to a corresponding input pad of the device-under-test. Similarly, it will be assumed that any end which is identified by a reference number starting with 52, such as ends 52*a* and 52*b*, corresponds to a sense channel of the network, that is, the outgoing signal from a particular output pad of the device-under-test is directly transferred to a corresponding one of these ends for subsequent transmission to a respective sensing unit in the measurement network. Finally, it will be assumed that any end which is identified by a reference number starting with 54, such as ends 54*a* and 54*b*, corresponds to a ground return line for the source and sense channels of the network, that is, during device measurement, each such end connects to a corresponding ground pad of the device-under-test so that a well-constrained ground line is established for each signal channel. This designation of particular ends as corresponding to either source, sense or ground return lines is conventional and is indicated herein only to clarify the operation of the exemplary interconnect assembly 48, a portion of which is also shown in FIG. 7 in sectional view.

Figure 5:
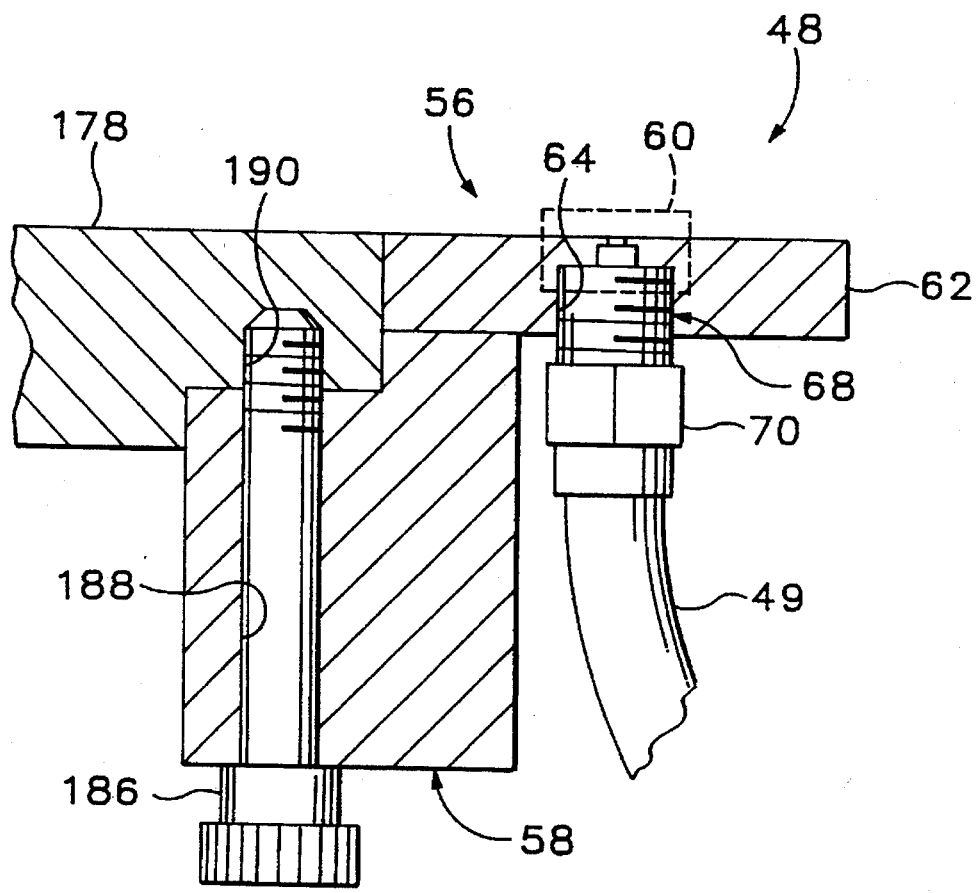
FIG. 5 is a sectional view primarily of the exemplary interconnect assembly as taken along lines 5—5 in FIG. 4.

Referring to FIGS. 4 and 7 together, the exemplary interconnect assembly 48 enables uniform transfer of high-frequency signals between the reference channel 49 and each signal-carrying end (e.g, 50*a–b* and 52*a–b*). This, in turn, makes it possible to obtain accurate comparative information about the relative signal conditions in the different channels and thus, in accordance with a preferred method described hereinbelow, enables accurate calibration of the probe measurement network 21. Referring also to FIG. 5, the assembly 48 includes a base assembly 56 and a movable support assembly 58. The characteristics of the base assembly, in particular, enable signal transfer operations to be performed with substantial uniformity.

The preferred construction of the base assembly 56 is best illustrated in FIG. 7 which, in enlarged sectional view, shows the central region of the base assembly as included within the dashed-lined area 60 identified in FIG. 5. The base assembly 56 includes a base member 62 which, in the preferred embodiment shown, constitutes a plate of solid brass. A series of concentrically aligned cavities are centrally formed in this plate including a lower threaded cavity 64 within which a high-frequency coaxial adapter 68 is screwably installed. In the preferred embodiment shown, this adaptor is a "sparkplug" type K-connector of the type sold, for example, by Wiltron Company of Morgan Hill, Calif. under Model No. K102F. This adaptor enables detachable connection of different types of reference units (i.e., of sensing or sourcing type) to the base member 62. Such connection can be made, as shown, through a coaxial cable 49, the end of which includes a threaded connector 70 which is suitably dimensioned for attachment to the adapter.

Formed within the brass base member 62 above the lower threaded cavity 64 are a lower mounting cavity 72, center cavity 74 and upper mounting cavity 76. A K-connector bead 78 is mounted within the lower mounting cavity 72. This bead, also known in the art as a "glass" bead, is used in conventional assemblies in connection with an associated fixture in order to interconnect a K-connector of the type above described-with a planar microstrip line. A bead of suitable type, for example, is sold by Wiltron Company under Model No. K100. This bead includes an inner conductor 82 that has a nominal diameter of about 12 mils. In this application, the first or lower end 80 of the inner conductor 82 is insertably engaged, in a conventional manner, with the tubular center conductor 84 of the K-connector 68. The second or upper end 86 of the inner conductor 82, which normally extends outwardly from the bead for connection with a microstrip line, is cut short so that only a small portion of the inner conductor extends past the surrounding inner dielectric 88 of the bead, as shown. The inner dielectric of the bead is made of glass for low-loss transmission of high-frequency signals and the bead further includes an outer conductor or metalized rim 90 that concentrically surrounds the inner conductor 82. This rim is soldered to the lower mounting cavity 72 so that the bead 78 is fully seated within this cavity, as shown.

Figure 6:
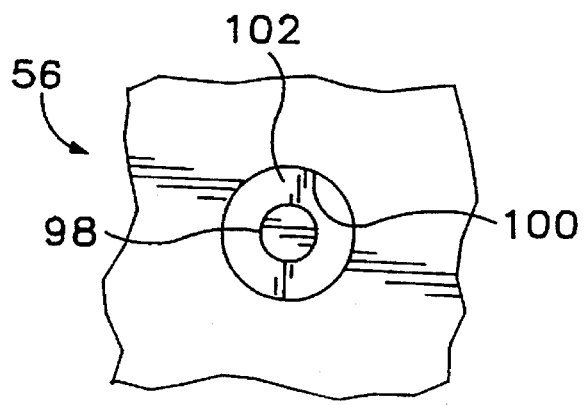
FIG. 6 is an enlarged cutaway plan view of the center portion of the exemplary interconnect assembly as taken within the dashed-line region indicated by reference number 60 in FIG. 5.

A pocket 92 is drilled into the upper end 86 of the inner conductor 82 of the bead and a length of copper wire 94 of 3 mil nominal diameter or other suitable conductor is anchored by its lower end within the pocket by a low temperature solder 95 so that the respective center axes of the wire and the inner conductor are aligned. An annular-shaped glass sleeve 96 of 10 mil wide outer diameter is then fitted over the wire, and the outer sides of the sleeve are epoxied to the upper mounting cavity 76 of the brass base member 62. Within the center cavity 74 of the base member, the lower face of the glass sleeve abuts the upper end 86 of the inner conductor 82. A lapping process is used to remove excess material along the upper face 104 of the base member so as to present a completely flat and smooth surface along this face. The upper face of the brass base member 62 and the upper end of the wire 94 are gold plated using an electroplating bath while the upper face of the glass sleeve 96 is covered by a mask. Referring also to FIG. 6, in accordance with these processing steps, the plated surfaces of the wire 94 and the brass base member 62 form a first or inner planar probing area 98 and a second or outer planar probing area 100, respectively. As shown in FIG. 6, the outer probing area 100 is radially spaced apart from and completely surrounds the inner probing area 98, and the exposed face of the glass sleeve forms an annular-shaped dielectric area or "transmission window" 102 between these two probing areas.

Referring to FIGS. 6 and 7 together, the inner and outer probing areas 98 and 100 are both included on the upper face 104 of the base member 62. As used in this context, the term "on" is intended to mean "within the outer boundaries of." It will be seen from FIG. 7 that the inner and outer probing areas 98 and 100 and the dielectric area 102 are substantially level with each other so that there is no protruding edge along the upper face 104 of the base member that could snag and damage the delicate needle-probe tips 34 as these probe tips are being moved between different probing positions on the probing areas.

A high-frequency transmission structure or channel 106 is formed within the base member 62 in such a manner as to be integrally connected with the respective probing areas 98 and 100. In effect, the areas 98 and 100 define that section of the transmission structure which adjoins the upper surface 104 of the base member. This transmission structure enables high-frequency signals to travel through the base member perpendicular to the principal plane of the base member. In the preferred embodiment shown in FIG. 7, the transmission structure has inner and outer boundaries where the outer boundary is formed by the upper mounting cavity 76, the center cavity 74 and the inner surface 108 of the metalized rim 90. The inner boundary of the transmission structure is formed by the respective outer surfaces of the copper wire 94 and the inner conductor 82.

The high-frequency transmission structure 106 is connected to the high-frequency coaxial adapter 68 at a reference junction 110 (a portion of the inner conductor 82 extends past this reference junction to mate with the tubular center conductor 84 of the coaxial adapter). The reference junction is suitably configured for connection to the reference sourcing or sensing unit. In particular, the reference unit can either be connected directly to the reference junction with its connector screwed into the lower threaded cavity 64 or, as shown in FIGS. 5 and 7, the reference unit can be connected indirectly to the reference junction by a coaxial adapter 68 and a coaxial cable 49. The advantage of using the cable is that the reference junction can, as the need arises, be flexibly connected to more than one type of reference unit. Essentially, then, with respect to the exemplary interconnect assembly 48, the reference junction 110 serves as either a presentation node or a sampling node for reference signals.

As previously noted, FIG. 6 shows a plan view of the inner probing area 98 as well as that portion of the outer probing area 100 which is contained within the dashed-line area 60 indicated in FIG. 5. The portions of the outer probing area that are not shown in FIG. 6 extend to the outer edges of the base member 62 (FIG. 7). Thus, as indicated in FIG. 4, the outer probing area is considerably larger than the inner probing area and, indeed, nearly covers the entire upper side of the assembly 48. Referring to FIGS. 6 and 7 together, the inner and outer probing areas are so arranged in relation to each other than any neighboring pair of device-probing ends of the probe assembly 30, such as ends 50*a* and 54*a*, can be simultaneously placed on the inner and outer probing areas so that one end is positioned on each area. During this placement process, the compatible planar geometry of both the ends and the areas-not only serves to reduce wear but also ensures that any signal exchanges between the probe assembly 30 and the interconnect assembly 48 occur uniformly through the extreme ends of the probe assembly rather than through signal exchange sites on the probe assembly that are randomly located further up along the probe tips.

Referring to FIG. 7, when the signal-carrying end 50*a* and its corresponding ground return end 54*a* are placed on the inner and outer probing areas 98 and 100, respectively, the transmission structure 106 provides a transmission line between these ends and the reference junction 110. In the preferred embodiment shown, this transmission line assumes the form of a coaxial-type channel having inner and outer conductive boundaries, as previously noted, where the diameter of the inner and outer boundaries changes in a stepwise manner along the axis of the channel so as to reduce transition discontinuities.

More generally, the term "transmission line" as used herein and in the claims is intended to denote any signal-guiding structure that includes spaced-apart boundaries, where the boundaries are capable of supporting a high-frequency field so as to enable the propagation of a high-frequency signal along the boundaries. These boundaries can comprise, for example, reflection surfaces between which, at any section of the line, there is a predetermined spacing to ensure signal stability. Although the preferred embodiment of the transmission structure 72 has boundaries which are formed by certain portions of the metallic surfaces of the brass base member 62, the K-connector bead 78 and the copper wire 94, for certain applications it may be preferable to construct the transmission structure without any metallic materials. If the signal frequency of the probe network is within the optical portion of the frequency spectrum, for example, it may be preferable to construct the transmission structure using only dielectric-materials in which the boundaries are formed by differently doped regions in like manner to an optical fiber. Similarly, the term "conductive," as used herein and in the claims, is intended to refer generally to the ability of a certain element to conduct a signal without limitation as to whether or not, for example, the element is a metal.

With respect to the exemplary embodiment shown in FIG. 7, the configuration of the transmission structure 106 is such that for each different position that the ends 50*a* and 54*a* can occupy when they are placed on the corresponding areas 98 and 100, the transmission line which the structure provides between these ends and the reference junction 110 has a substantially constant high-frequency transmission characteristic. In particular, the transmission structure is so configured that a signal traveling along the structure propagates in a direction perpendicular to the plane of the probing areas rather than in a direction parallel to that plane. As a result, the size of the inner probing area 98 is not determined by the length of the transmission structure and hence can be reduced, as shown, to a dimension approximately corresponding to that of each device-probing end. In FIG. 7, accordingly, if the inner probing area 98 is lifted straight up in the direction indicated, so as to come into contact with the device-probing end 50*a*, regardless of whether this end was initially in a centered position relative to the area, as shown in solid-line view, or was, instead, in a misaligned position 112 off to one extreme edge of the area, as indicated in dashed-line view, once the end is actually positioned on the area, a signal passing between the end and the reference junction will travel over substantially the same path for either position. That is, the signal will experience substantially the same delay, loss and dispersion for each position in accordance with the characteristics of the transmission line provided by the structure 106.

Figure 11A:
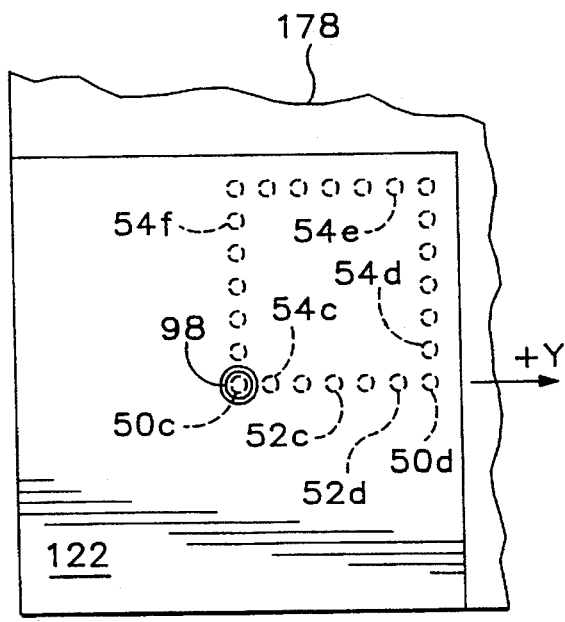
FIGS. 11a–d are schematic plan views depicting consecutive positions of the device-probing ends of the probe card, represented in dashed-line view, on the probing areas of the exemplary interconnect assembly of FIG. 4, represented in solid-line view, during an exemplary probe network evaluation session.
Figure 11B:
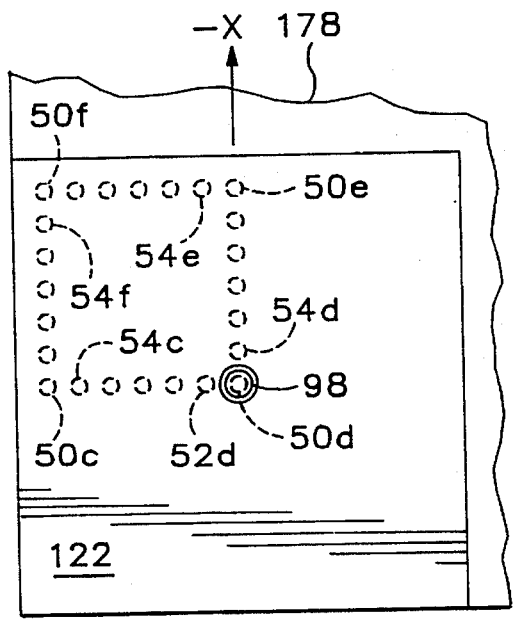

Just as it is possible for the respective signal-carrying ends to occupy different positions on the inner probing area 98, so it is also possible for the respective ground return ends to occupy different positions on the outer probing area 100. This is best illustrated in FIGS. 11a–11d which indicate, with directional arrows, how the exemplary interconnect assembly 48 is shifted in mutually perpendicular directions during a typical network evaluation session in order to consecutively position different ends of the probe array on the inner probing area 98, including the corner ends 50c–50f. In FIGS. 11a–11d, the device-probing ends of the network are represented in dashed-line view and the number of ends per side is considerably reduced from their actual number for ease of illustration. Referring to FIG. 11a, it will be recognized that when the signal-carrying end 50c is positioned on the inner probing area 98, the corresponding ground return end 54c is positioned on the outer probing area 100 in a position lying to the "east" of the inner probing area. On the other hand, as shown in FIG. 11b, when the signal-carrying end 50d is positioned on the inner probing area because of a shift by the exemplary assembly 48 in the direction indicated in FIG. 11a, the corresponding ground return end 54d is positioned on the outer probing area in a position that now lies to the "north" of the inner probing area. Similarly, as indicated by the position of end 54e in FIG. 11c and by the position of end 54f in FIG. 11d, in accordance with the shifting sequence shown, it is also possible for the respective ground return ends to occupy positions on the outer probing area that lie to the west or south of the inner probing area.

Regardless, however, of whether the ground return end occupies a position lying to the north, south, east or west of the inner probing area 98, the corresponding transmission path provided by the transmission structure 106 is substantially the same for each position. Referring to FIGS. 6 and 7 together, it will be recognized that as long as the subject signal-carrying end remains in its position on the inner probing area 98, the geometry, and hence circuit characteristic, of the outer probing area 100 will appear substantially identical to the corresponding ground return end for any angular position which that end can then occupy. Similarly, subject to the same condition, the geometry of the upper mounting cavity 76, the center cavity 74 and the inner surface 108 of the rim 90 will appear the same to the ground return end with respect to any angular position of that end due to the angular symmetry of each of these elements. Hence, the exemplary transmission structure 72 provides an omnidirectional transmission line which, in relation to any pair of corresponding ends, presents a substantially uniform transmission characteristic for any angle which those ends can assume while remaining on their corresponding areas.

Referring to FIG. 7, the exemplary transmission structure 106 therein shown not only provides a stable transmission line between the ends of the probing network and the reference junction 110 for different positions of the ends on the corresponding areas 98 and 100, but also is so configured that high-frequency signals that are present in the environment but that are not the subject of evaluation will, as a general matter, be prevented from entering this transmission line. For example, the incoming signal that is the subject of evaluation in FIG. 7, that is, the signal which is contained in the field supported by ends 50a and 54a, will have little difficulty passing through the energy "window" that is provided by the dielectric area 102 between the inner probing area 98 and the outer probing area 100. On the other hand, the incoming signal that is contained in the field supported by ends 50b and 54a, which signal is not of interest, will be reflected the moment it reaches the plane of the outer probing area 100 in a direction away from the transmission line. In effect, the outer surfaces of the base member 62 form an electromagnetic shield in relation to the transmission line that substantially prevents radiation from entering the line from any source adjacent the substrate's upper face 70 that is other than the device-probing end under evaluation.

Referring to FIG. 7, it has now been described how the base assembly 56 facilitates uniformity of signal transfer between the device-probing ends of the network and the reference junction 110. In particular, it has been explained how the signals which pass between the ends and the reference junction are substantially unaffected by the type of variation in probing position that is likely to occur as the inner probing area 98 is shifted from end-to-end. It has further been explained how the base assembly 56 rejects high-frequency signals, except from the subject channel, so that these signals cannot enter the evaluation path and distort the signal of interest. Accordingly, at least two distinct aspects about the base assembly 56 facilitate uniformity of signal transfer, namely its substantial immunity to normal probing position variation and its substantial immunity to spurious signals.

Figure 8:
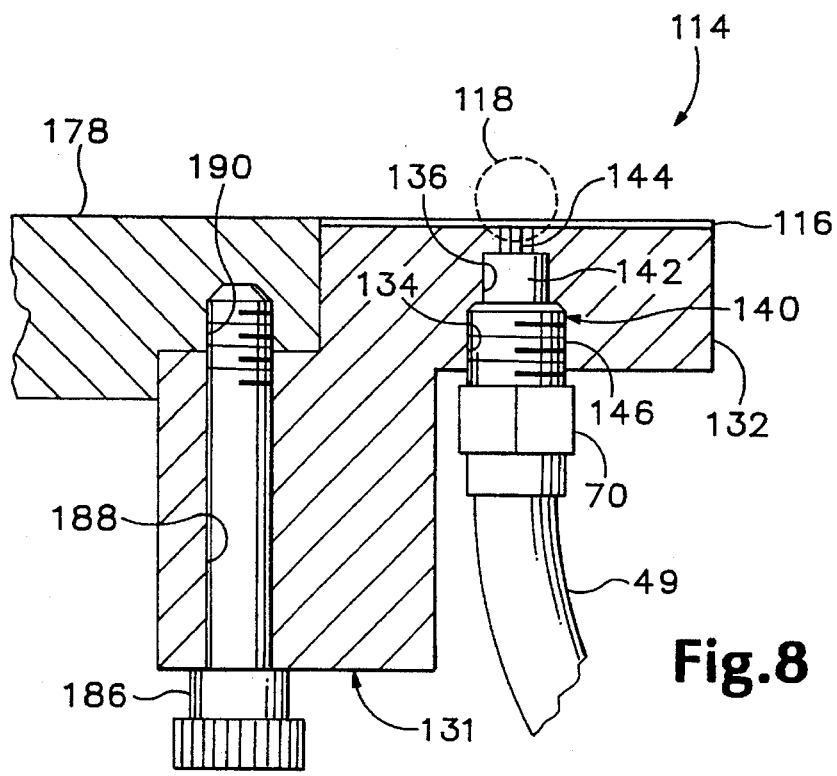
FIG. 8 is a sectional view corresponding in viewing angle to the view of FIG. 5 of a first alternative embodiment of the interconnect assembly.
Figure 9:
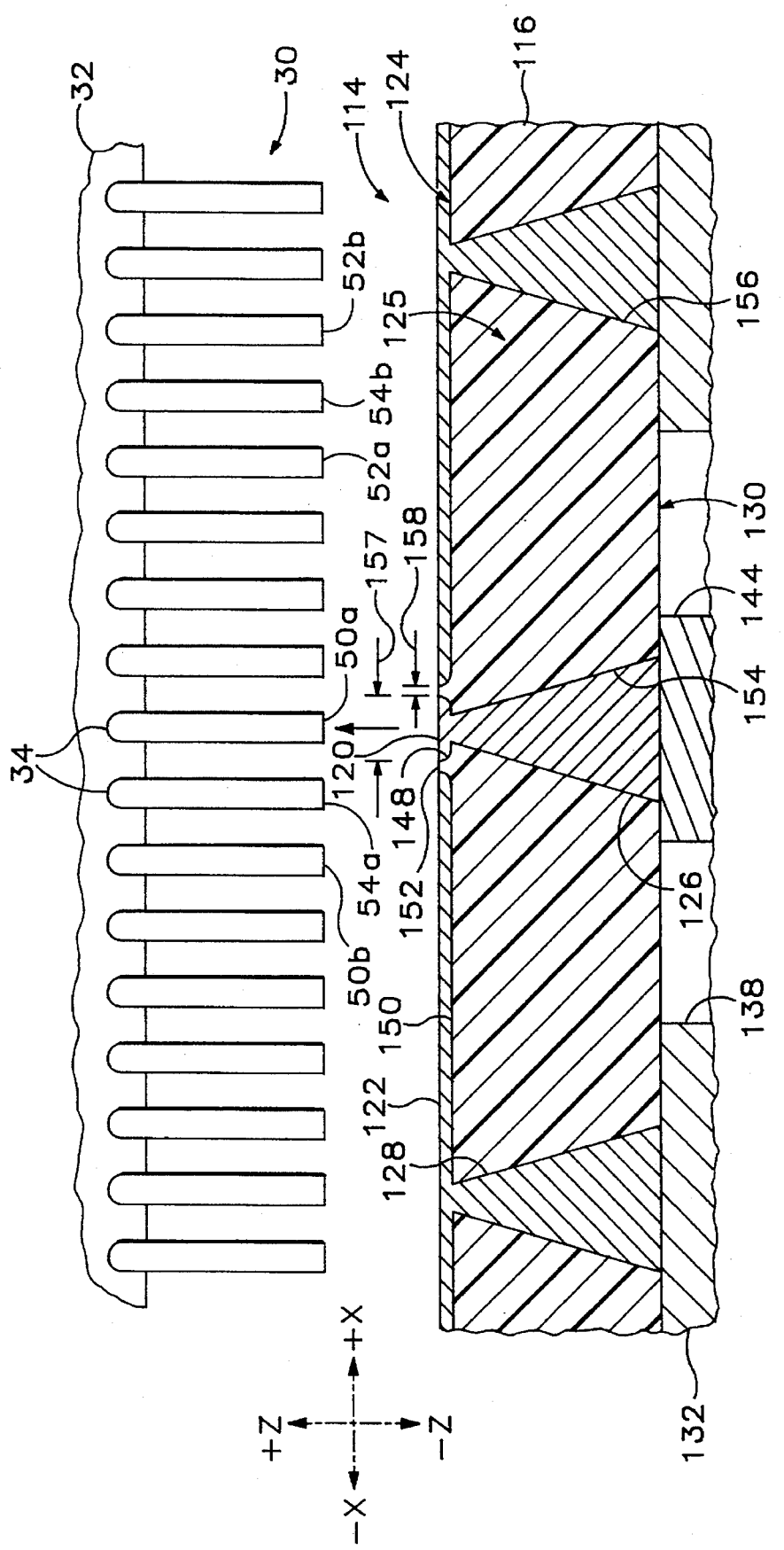
FIG. 9 is an enlarged sectional view of the first alternative embodiment of FIG. 8, as taken within the dashed-line region indicated by reference number 118 in FIG. 8, together with an enlarged elevational view of certain of the device-probing ends of the probe card of FIG. 4 so as to indicate the arrangement of these ends relative to the probing areas of the assembly.

It will be recognized that alternative forms of the interconnect assembly 48 are possible. For example, referring to FIGS. 8 and 9, which correspond in viewing angle to FIGS. 5 and 7, respectively, a first alternative embodiment 114 of the interconnect assembly is shown. In this embodiment, the base member 116 constitutes a substrate which is only about 5 to 25 mils thick with a nominal thickness of about 10 mils. This substrate is preferably made of glass or other hard dielectric material in order to reduce the flow of leakage currents within the substrate at higher frequencies. Referring to FIG. 9, which is an enlarged view of the dashed-line area 118 shown in FIG. 8, a first or inner planar probing area 120 and a second or outer planer probing area 122 are formed by a metalization process on the upper face 124 of the base member so that these areas are in mutually coplanar relationship with each other. As was the case with the exemplary interconnect assembly 48, the first and second probing areas 120 and 122 define the upper end of a transmission structure 125 that enables high-frequency signals to travel through the base member perpendicular to the principal plane of such base member. In the first alternative embodiment 114, the inner and outer boundaries of the transmission structure are formed by a first or inner conductive via 126 and a second or outer conductive via 128, respectively, where the outer conductive via is generally annular in shape. Each via 126 or 128 is embedded within the substrate and extends directly beneath the corresponding probing area 120 or 122.

The first alternative embodiment 114 of the interconnect assembly, like the exemplary interconnect assembly 48, includes a reference junction 130. In the first alternative embodiment, this reference junction is defined by that section of the high frequency transmission structure 125 which is contiguous with the lower surface of the substrate 116.

The movable support assembly 131 of the first alternative interconnect assembly 114 includes a horizontal portion 132.

A concentrically aligned series of cavities 134, 136 and 138 are formed in this horizontal portion, and a high-frequency "sparkplug" type connector 140 is screwably installed into the lowest cavity 134. A protruding portion of an inner dielectric 142 of this connector is received by the center cavity 136, and an exposed center conductor 144 of the connector passes through the upper cavity 138 for electrical connection with the inner via 126. The outer conductive shell 146 of the connector 140, on the other hand, makes electrical connection with the outer via 128 through the conductive body of the movable support assembly 131. Solder, conductive epoxy or other electrically conductive joining material is used to permanently bond the center conductor 144 to the inner via and the conductive body of the movable support assembly 131 to the outer via. These connections ensure continuity in the ground return path for any ground return end positioned on the outer probing area 122 and also provide a well-isolated controlled impedance path for all signals transmitted between the reference junction 130 and the reference channel 49. As with the exemplary interconnect assembly 48, the high-frequency connector 140 of the first alternative interconnect assembly 114 can be removed, and the connector head of a reference unit can be connected directly to the reference junction 130.

Referring to FIG. 9, the outer boundaries of the inner probing area 120 and the outer probing area 122 are defined by an inner well 148 and an outer well 150, respectively, that are formed on the upper face 124 of the substrate 116. A high-definition masking process and a suitable etching agent, such as hydrofluoric acid, are used to form these wells. As shown in FIG. 9, the wells are separated from each other by a narrow annular ridge 152 of substrate material. Within the substrate 116, inner and outer sloping wall channels 154 and 156 are formed using a laser. These channels define the boundaries of the inner and outer vias 126 and 128. In forming the sloping wall channel 154 for the inner via, the translucent property of the glass substrate permits the laser beam to be accurately focused directly opposite and on-center with the well 148 that was previously etched for the inner probing area. The inner and outer wells 148 and 150 and the corresponding sloping wall channels 154 and 156 are then filled with nickel or some other suitably hard metal (such as tungsten, iridium or rhodium) in such a manner that the metal in the wells is able to fuse with the metal in the channels. The sloping-wall shape of each channel facilitates this fusing process by making it easier for the metal to flow into and completely occupy each channel. An alternative approach is to omit the step of forming the wells 148 and 150 and to simply deposit extremely thin layers of conductive material on the substrate 116 to form the probing areas 120 and 122. Under this alternative approach, however, there is a significant risk that the ends of the tips 34 will punch through the thin probing areas if an excessive amount of contact force is applied between these ends and the areas.

After being formed, the upper surfaces of the inner and outer probing areas 120 and 122 are then lapped until the resulting overall surface is completely flat and smooth. As with the exemplary interconnect assembly 48, this step ensures that there are no protruding edges left on the upper face of the assembly 114 which could snag and damage the delicate needle-like tips during repositioning of the assembly. In the embodiment of the first alternative interconnect assembly shown in FIG. 7, the maximum edge-to-edge dimension 157 of the inner probing area 120 is nominally 4 mils while the radially-extending gap 158 between the inner and outer probing areas 120 and 122 is nominally ½ mil across.

From the foregoing description of the first alternative interconnect assembly 114, it will be recognized that the basic components of this assembly correspond to those of the exemplary interconnect assembly 48, insofar as both assemblies include a base member 62 or 116, first and second planar probing areas 98 and 100 or 120 and 122 on the base member, a transmission structure 106 or 125 extending perpendicular to the principal plane of the base member and a reference junction 110 or 130 that serves as a connection site for the reference unit. It will further be recognized that the functional advantages noted above in connection with the exemplary interconnect assembly 48 apply equally to the first alternative interconnect assembly 114, that is, the assembly 114 is able to uniformly transfer signals despite variation in the position of the device-probing ends 34 on the probing areas and, furthermore, is able to reject spurious signals that originate outside of the channel under evaluation.

As shown in FIGS. 7 and 9, both the exemplary interconnect assembly 48 and the first alternative interconnect assembly 114 include two probing areas on their respective upper faces consisting of the inner probing area 98 or 120 and the outer probing area 100 or 122. This configuration is suitable for the closely crowded needle-like tips 34 (FIG. 4) which are commonly used to test microelectronic devices, particularly since the signal field of any one channel in this type of network is supported between a corresponding signal tip and a nearby ground return tip. However, it may be preferable in some applications to have only one probing area on the upper face of the assembly (as, for example, when the signal field is carried by a single optical fiber). Furthermore, in order to evaluate some types of probe network conditions, such as the cross-talk between two signal channels of the network, it may be desirable to have three probing areas on the substrate's upper face.

Figure 10:
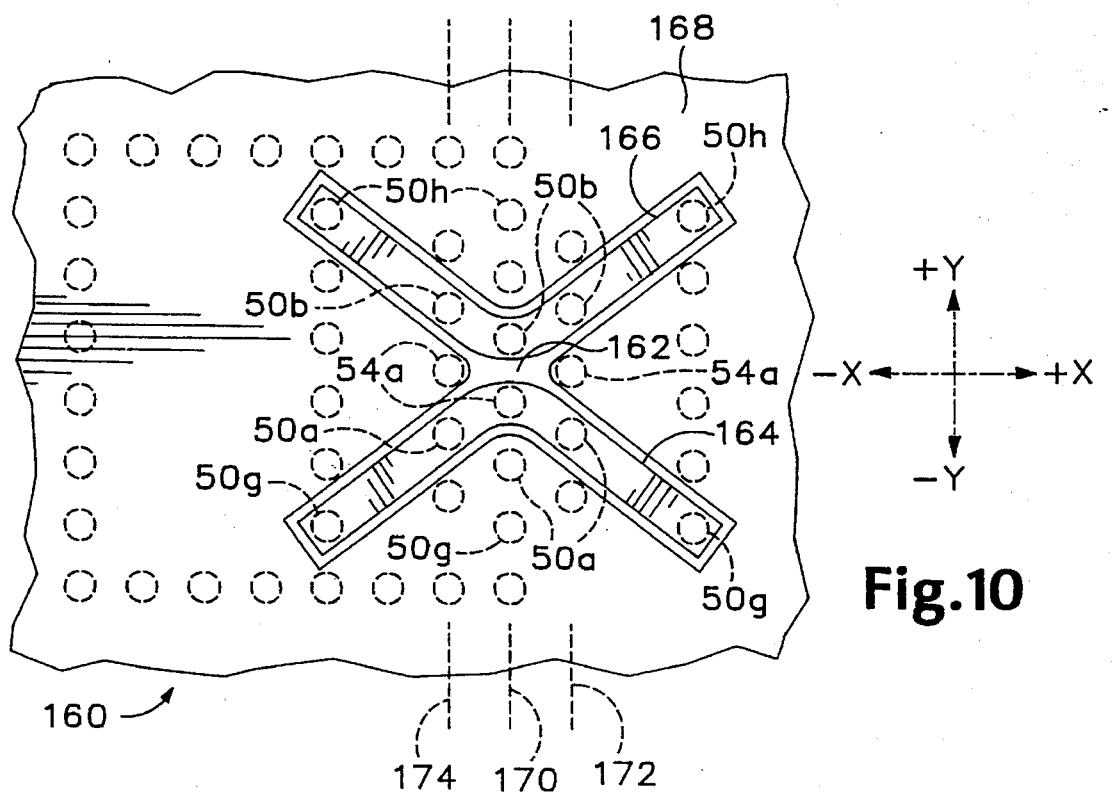
FIG. 10 corresponds to FIG. 6 except that it shows, in solid-line view, the probing area configuration of a third alternative embodiment of the interconnect assembly especially suited for the simultaneous measurement of a pair of signal channels and further shows, in dashed-line view, different positions which the device-probing ends can occupy in relation to this probing area configuration.

FIG. 10 shows a second alternative embodiment 160 of the assembly which includes three probing areas for use in evaluating network conditions such as cross-talk. This embodiment includes a base asssembly comprising a substrate 162 on the upper face of which is a first inner probing area 164, a second inner probing area 166 and a third or outer probing area 168. If the substrate 162 were to be viewed in section along the reference line 170, the resulting figure would correspond closely to FIG. 9 except that there would be a pair of inner vias in balanced arrangement within the outer via 128 instead of only one inner via 126.

In FIG. 10, the device-probing ends are represented in dashed-line view. With respect to one of the illustrated probing positions, the entire probing array is depicted in order to show how the square-like probing array is preferably oriented in relation to the three probing areas during evaluation of the probing network. The number of ends per side of the array has been reduced from their actual number for convenience and clarity.

For purposes of illustration, it will be assumed that the two signal-carrying ends 50a and 50b correspond to the two channels of the network that are the subject of interest and that the corresponding ground return end is 54a. It will be recognized that when these ends are in the center probing position illustrated, that is, when these ends are aligned with reference line 170, then the ends are mispositioned since end 50a, corresponding to a signal-carrying channel, properly belongs on one of the inner or signal probing areas 164 or 166, while end 54a, corresponding to a ground return line, properly belongs on the outer or ground probing area 168. It is possible, however, to shift the substrate 162 so as to simultaneously position these three ends on corresponding ones of the areas. That is, the substrate can be shifted so that the first signal-carrying end 50*a* occupies a position on the first inner probing area 164, the second signal-carrying end 50*b* simultaneously occupies a position on the second inner probing area 166 and the ground return end 54*a* simultaneously occupies a position on the third or outer probing area 168. For example, the substrate can be shifted in the −X and −Y directions indicated in order to reposition these ends to the illustrated probing position that is in alignment with reference line 172. Alternatively, the substrate can be shifted in the +X and −Y directions indicated in order to reposition these ends to the illustrated probing position that is in alignment with reference line 174.

In the example just given, it will be recognized that in order for all three ends 50*a*, 50*b* and 54*a* to be simultaneously placed on the corresponding areas identified above, one or the other of the two illustrated probing positions that is in alignment with reference lines 172 or 174 has to be selected. Because of the symmetry of these two probing positions with respect to the illustrated center probing position and also because of the balanced arrangement of the inner vias relative to the outer via in the underlying transmission structure, a transmission line of substantially constant high-frequency transmission characteristic is presented to ends 50*a*, 50*b* and 54*a* for each probing position in which the three ends are simultaneously situated on their corresponding areas. FIG. 10 also illustrates how the probing area configuration provided by the second alternative embodiment 160 accommodates the evaluation of cross-talk between two network channels even when the corresponding ends of the network are spaced widely apart, as is the case with ends 50*g* and 50*h*.

As explained above, the coaxial adapter 68 or 140 of each interconnect assembly provides a means through which different types of reference units can be conveniently connected to the corresponding reference junction 110 or 130. However, various other types of connections to each reference junction are also possible. For example, it is possible to adapt each reference junction for direct connection with switches, noise sources, diodes, power sensor elements, couplers, in-line transmission devices and various other components. Furthermore, a pair of coaxial adapters instead of only one adapter could be connected to the junction. This last type of connection is the type preferably used, for example, where the interconnect assembly includes a pair of inner probing areas 164 and 166, as shown in FIG. 10. As noted above, the second alternative embodiment 160 shown in FIG. 10 is configured so as to include two inner vias, thus providing sufficient attachment sites for the connection of two adapters. Such connection permits differential measurements to be made between two different signal channels of the probing network.

Another variation is to eliminate the movable support assembly 58 or 131 so that the base member 62 or 116 is simply placed on the chuck of any probing station in the same manner as a wafer. With respect to this embodiment, any coaxial adapter that is provided on the base member would be included on the upper side of such base member (i.e., in a position that would not interfere with the placement of the device-probing ends). To convey the signal between the reference junction adjacent the lower side of the base member and the adapter on the upper side, a two-section transmission line may be used, where one section extends between the reference junction and a point opposite the adapter and the second section, starting from that point, extends through the substrate to the adapter. Still another variation is to connect a first circuit element to the reference junction on the basis of the characteristics of a second circuit element that is connected directly between the inner and outer probing areas 98 and 100 so that a signal entering the transmission structure 106 will, in effect, see a different circuit depending on whether it enters that structure from the upper or lower end. The types of elements that are suitable for connection directly between the inner and outer probing areas include chip resistors, capacitors and inductors.

Yet another variation is to utilize a connected pair of interconnect assemblies 48 and to support this pair of assemblies so that the spacing between the corresponding pair of inner probing areas 98 is adjustable so as to enable probing of the inner probing area of one of the assemblies by a selected one of the "stimulus" probe ends (e.g., 50*b*) while concurrently enabling probing of the inner probing area of the other assembly by a designated one of the "response" probe ends (e.g., 52*b*) regardless of the spacing that exists between these ends. In this variation, the outer probing area 100 surrounding each inner probing area is reduced in size (e.g., to a nominal radius of about 20 mils) so that the respective inner probing areas of the corresponding assemblies can be moved adjacent to each other when measurements are to be taken across nearby probe ends.

In order to ensure that the electrical characteristics of the transmission channel between the two assemblies is constant for each selected spacing, the high-frequency adapters 68 of the two assemblies are normally connected together by a short length of flexible coaxial line, although other types of circuit elements can be used as well. The relative positions of the two assemblies may be adjusted by providing a first mechanism for adjusting the linear separation between the two assemblies, a second mechanism for rotating both assemblies in unison, and a third mechanism for effecting X-Y-Z directional movements of the wafer stage that carries both assemblies.

Referring to FIGS. 4 and 5 together, in accordance with a preferred embodiment of the invention, the exemplary interconnect assembly 48 hereinabove described is combined with the probe station containing the measurement network 21 so as to form an integrated self-evaluating probing system 176. The exemplary interconnect assembly can either be mounted directly on the wafer-supporting chuck 178, as shown, or can be mounted separately off to one side of the chuck.

Figure 1:
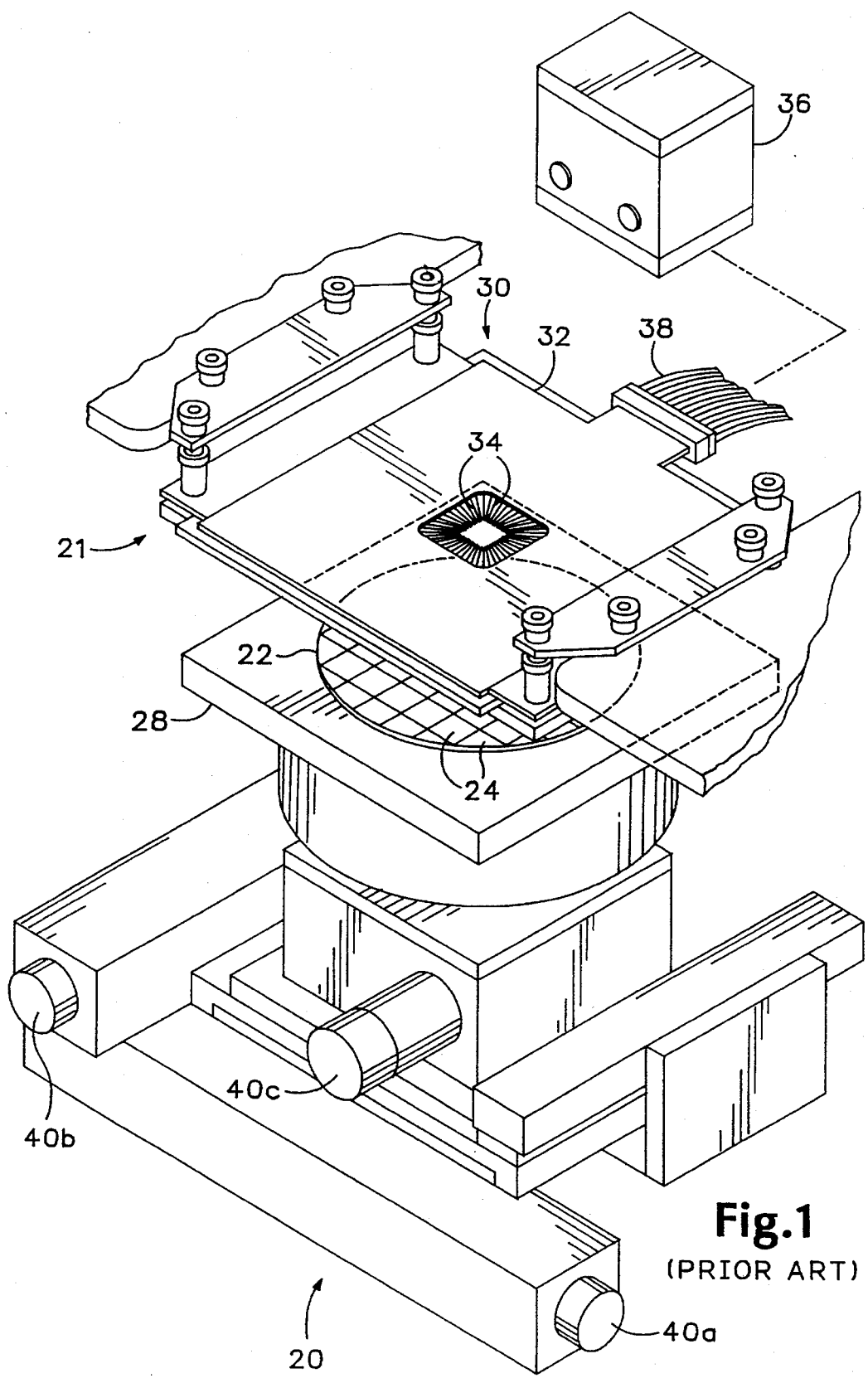
FIG. 1 is a perspective view of a probe station, in accordance with the prior art, which includes a probe measurement network having a probe card assembly for probing various microelectronic devices on a wafer, also shown.
Figure 2:
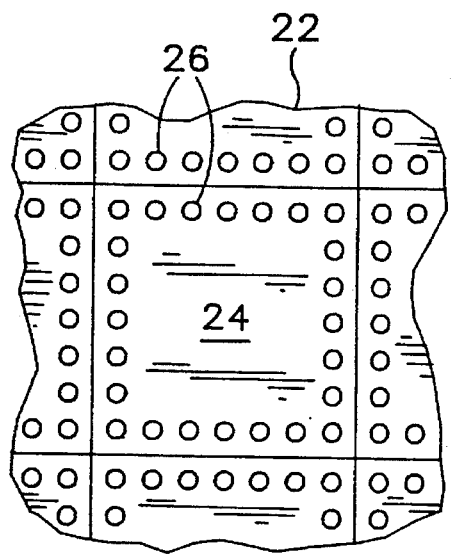
FIG. 2 is an enlarged cutaway plan view of an individual planar device located on the wafer of FIG. 1, which device is schematically represented for ease of illustration.
Figure 3:
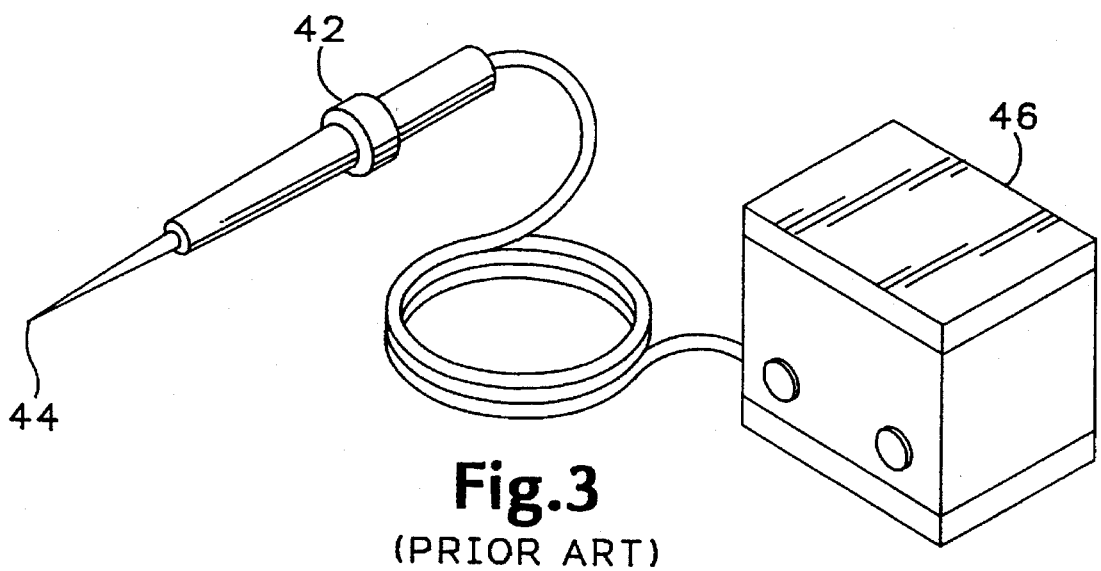
FIG. 3 is a perspective view of an interconnect assembly of a type used, in accordance with the prior art, for evaluating probe measurement networks of the type shown in FIG. 1.

Comparing the integrated probing system 176 with the commercially available wafer-probing station 20 shown in FIG. 1, it will be seen that the primary modification made to the pre-existing design in order to mount the interconnect assembly 48 on the chuck 178 has been to cut away a rectangular corner portion of the chuck so that the movable support assembly 58 of the interconnect assembly can be conformably fitted to the square-edged margin 180 thus formed on the chuck. In accordance with this mounting method, the inner probing-area 98 (FIG. 7) of the interconnect assembly is positioned in close proximity to the wafer 22, and hence only limited-range X-Y-Z movements are needed between the chuck 178 and the probe tips 34 in order to quickly shift these tips back-and-forth between various device-measuring positions on the wafer 22 and various channel-evaluating positions on the interconnect assembly 48. With respect to the particular system configuration shown, this mounting method also allows the probe tips to be shifted between their various device-measuring positions and their various channel-evaluating positions using the same motorized X-Y-Z positioning table 182 included in this system for positioning the chuck. However, whether the interconnect assembly 48 is mounted in adjoining relationship to the wafer-supporting chuck 178, is mounted separately off to one side of the chuck, or is transported to the chuck as the need arises, it is advantageous when evaluating the probing network 21 to locate the interconnect assembly in the wafer-probing station, rather than locating it in a separate evaluation station, in order to permit in situ evaluation of the network.

During in situ evaluation of the probe measurement network 21, the original connections that are made in setting up the network are maintained during evaluation of the network. Accordingly, the results of this evaluation will accurately reflect the respective contributions made by the original measurement cable 38 and the original test instrument 36 to the various signal conditions present in the different channels of the network. On the other hand, if it were necessary to evaluate the network off-site or in a piecemeal manner, then it would be difficult to determine the original conditions in the network with the same degree of accuracy.

For example, if the exemplary interconnect assembly 48 was so constructed that it could not operate properly unless the signals entering through the network were first routed through an intermediate processing unit, then to use this assembly, it would be necessary to change the connections of the original measurement network in order to connect the unit between the network and the assembly. With respect to the network 21 shown in FIG. 4, for example, the probe card 30 might be disconnected from the original measurement cable 38 and removed to a separate evaluation station for connection to the processing unit. In this example, because evaluation of the probe card portion of the network would be performed separately from evaluation of the cable and instrument portions of the network, the resulting procedure would be inherently slower and less accurate than in situ evaluation where the entire network is evaluated at the same time.

With regard to the foregoing, it may be noted that the exemplary interconnect assembly 48 does not require a processing unit anywhere between its probing areas 98 and 100 and the probing network 21 in order for it to function properly. If, for example, the source channels of the probing network 21 are the subject of evaluation, the only connection needed to the interconnect assembly is the connection of a reference sensing unit to the reference junction 110 of the assembly. Typically, the original test instrument 36 will include at least one sensing unit that is not being used for device measurement, which can then be connected to the reference junction through the reference cable or channel 49. On the other hand, if the sense channels of the probing network 21 are the subject of evaluation, then the only connection needed to the assembly is the connection of a sourcing unit to the same reference junction. Typically, the original test instrument will further include an unused sourcing unit which can be connected to the reference junction merely by switching the reference cable 49 to the corresponding port on the instrument, as through a switching device.

As the above examples illustrate, the same piece of equipment 36 that is included in the system 176 to process the signals needed for device measurement can also be used, in conjunction with the exemplary interconnect assembly 48, to process the signals needed for evaluating the system's own probing network, and there is no need, however the assembly is connected, to divide the network 21 into separate parts in order to use the assembly to evaluate the network. As these two examples further illustrate, the interconnect assembly 48 is bidirectionally operable and hence can be used to evaluate each channel of the original probing network 21 regardless of whether the channel under evaluation is of source or sense type.

It has now been described how the configuration of the interconnect assembly 48 is compatible with in situ evaluation of the probe measurement network and how this procedure provides more accurate results by enabling the channel conditions present during network evaluation to more closely match those that are present during device measurement. A different aspect of the assembly with the same general effect is the ability of the interconnect assembly to emulate certain characteristics of a device while it is being probed by the ends of the network.

Referring to FIG. 7, it has been assumed, up to this point, that end 54a provides the ground return path in relation to the signal-carrying end 50a. More generally, however, the ground return path corresponding to end 50a may be provided by an end that is not immediately adjacent to end 50a, such as end 54b. In accordance with this more general situation, during device measurement, if end 50a were to be positioned on an input pad of a device under test, then end 54b would be positioned on a ground pad of the same device, so that a continuous ground path would be formed as a result of connection between end 54b and the ground pad. This continuous ground path, in turn, would have an effect on the characteristics of the circuit that is formed through ends 50a and 54b. This same continuity of ground path is provided, however, by the outer probing area 100, since this area is connected to the ground shield of the reference cable 49 through the outer shell of the threaded connector 70, the outer conductive shell of the coaxial adapter 68, and the conductive body of the brass base member 62. In effect, with respect to the ground return end 54b, the outer probing area 100 appears the same as the ground pad of a device under measurement and thus the channel conditions present during device measurement are substantially duplicated during network evaluation.

Referring to FIGS. 7 and 11a–11d, with respect to the exemplary interconnect assembly 48, any end that is out of contact with the inner probing area 98 will automatically be positioned in contact with the outer probing area 100. As shown, in FIGS. 11a–11d, for example, even if the end under evaluation is at one of the four extreme corners of the probe array, as is the case with ends 50c, d, e and f, if this end is positioned on the inner probing area 98, then all of the other ends, which include the ground return ends 54c, d, e and f, are automatically positioned simultaneously on the outer probing area 100. In this regard, the inner and outer probing areas 120 and 122 of the first alternative embodiment 114 are so arranged as to produce the same result. Likewise, with respect to the second alternative embodiment 160 shown in FIG. 10, if two signal-carrying ends, such as 50a and 50b, are simultaneously positioned so that each is on a corresponding one of the inner probing areas 164 or 166, then the other ones of the ends, such as the ground return end 54a, are automatically positioned simultaneously on the outer probing area 168. Thus, for each embodiment of the interconnect assembly hereinabove described, wherever the ground return end for a particular source channel happens to be located, the outer probing area 100, 122 or 168 will present the same characteristics to that end as would have been presented by the ground pad of a device during device measurement. It will be noted, on the other hand, that if any end not under evaluation corresponds to a source channel, such as end 502b in FIG. 7, the outer probing area will reflect the signal carried by that end away from the transmission structure 106 or 125, thereby preventing that signal from entering the evaluation channel and distorting the signal of interest.

Referring to FIGS. 4 and 5, with the movable support assembly 58 of the interconnect assembly conformably fitted to the chuck 178 in the corner position shown, there remains sufficient area on the chuck to support the circular wafer 22. Hence, the respective probing areas of the interconnect assembly 48 are continuously available for probing by the probing tips 34 free of any requirement for removal of the wafer from the chuck. This, in turn, facilitates rapid back-and-forth shifting of the probe tips 34 between various device-testing positions on the wafer and various channel-evaluating positions on the interconnect assembly.

Even greater speed in back-and-forth tip positioning is preferably obtained by using a programmable microprocessor 184 to control the motorized X-Y-Z positioning table 182. This microprocessor is programmed to deliver, in quick succession, a series of control commands to the positioning table so that predetermined ones of the device-probing ends are positioned by the table, likewise in quick succession, on the inner probing area 98 during network evaluation.

Figure 11C:
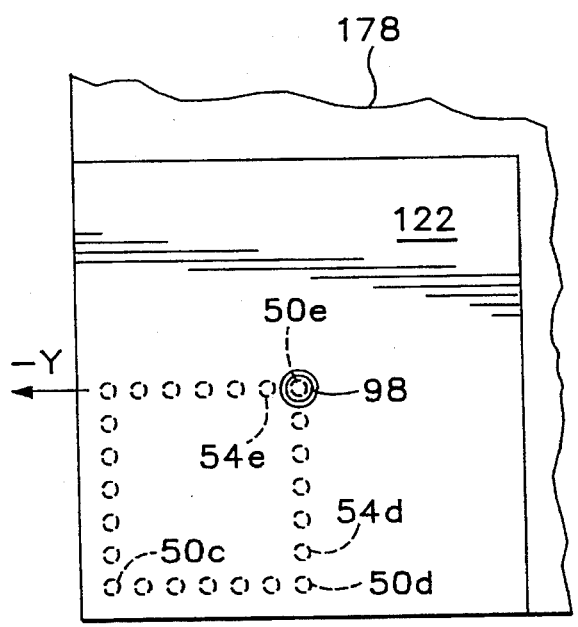
Figure 11D:
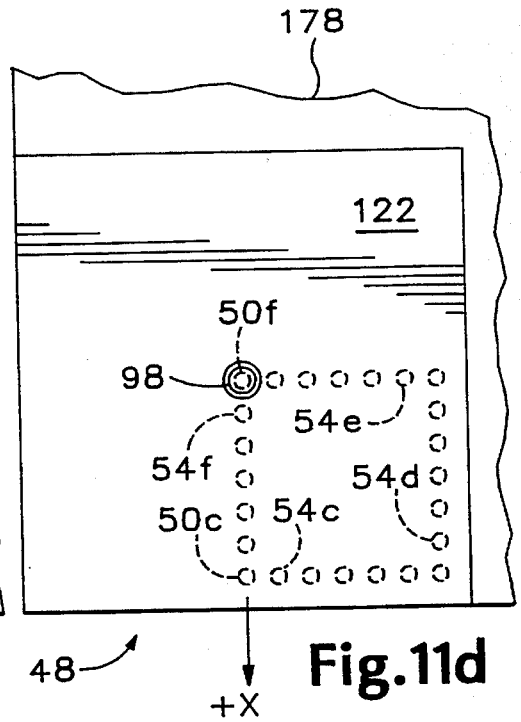

To evaluate the source channels of the network, for example, the reference junction 110 is connected to a reference sensing unit, and the microprocessor 183, in response to a user-generated signal, commands the positioning table to shift so as to move the inner probing area 98 to its starting position (e.g., in contact with end 50c) as shown in FIG. 11a. Following a preprogrammed set of instructions, the microprocessor then commands the positioning table 182 to move in specified increments along the +Y direction indicated so that, ultimately, each end along this direction that corresponds to a source channel, such as ends 50c and 50d, is successively positioned on the inner probing area 98. Referring to FIG. 11b, without interruption, the microprocessor next commands the positioning table to move by specified increments in the −X direction indicated so that each end along this direction that corresponds to a source channel, including ends 50d and 50e, is successively brought into contact with the inner probing area 98. Referring to FIGS. 11c and 11d, the same procedure is repeated in the −Y direction and the +X direction, thus successively positioning each of the ends in the probing array that corresponds to a source channel into contact with the inner probing area.

After the reference junction 110 has been reconnected to a reference sourcing unit, generally the same sequence is followed in order to evaluate the sensing channels of the measurement network. Starting from the position shown in FIG. 11a, for example, the microprocessor 184 begins the sequence by commanding the positioning table 182 to move by specified increments in the +Y direction indicated, so that each end along that direction that corresponds to a sense channel is successively positioned on the inner probing area, including ends 52c and 52d. This time, ends 50c and 50d, which correspond to source channels, are passed over. The remainder of the sequence proceeds in similar manner with respect to the other directions.

It is also possible to combine the two approaches just described, that is, the microprocessor 184 can be programmed so that it will instruct the positioning table 182 to successively shift the inner probing area 98 into contact with each end that generally corresponds to a signal channel. Depending, then, on whether the end specifically corresponds to a source channel or to a sense channel, a switching device that is operated by a control line from the microprocessor will automatically connect the reference junction 110 to either a sensing unit or a sourcing unit on the test instrument 36.

With respect to the interconnect assembly 48, a primary advantage to using the same probing area 98 for evaluating each signal channel is that if there are any differences detected between the signals in the different channels, these differences can be attributed directly to the signal channels themselves without further investigation required into the extent to which these differences might be based on differences in evaluation path. It may also be noted that while the primary anticipated use of the exemplary interconnect assembly 48 is for the comparative evaluation of probe measurement channels, the assembly can also be used for those situations where quick verification is needed of the quality of signal at a particular end while device measurement is in progress.

Referring to FIG. 4, damage to the needle-like probe tips 34 could easily result if these delicate tips were allowed to become snagged on any portion of the exemplary assembly 48 during rapid repositioning of the tips by the automated positioning mechanism just described. As noted above, the inner probing area 98, the dielectric area 102 and the outer probing area 100 are substantially level with each other so that there is no protruding shoulder along the upper face of the assembly which could snag and damage the tips.

Referring to FIG. 5, the movable support assembly 58 of the interconnect assembly is provided with a vertical adjustment knob 186 that enables adjustable positioning of the height of the base member 62 relative to the wafer-supporting chuck 178 so that the respective probing areas 98 and 100 are arranged in adjustable parallel relationship to the imaginary plane defined by the upper surface of the chuck. With this mechanism, then, it is possible to shift the probing areas to a position that is in coplanar relationship to the pads on each device 24 of the wafer, irrespective of the particular thickness of the wafer, thus enabling safe back-and-forth shifting of the ends between these pads and the areas. Referring to FIG. 5, the movable support assembly 58 defines a threadless hole 188 through which the shank of the knob bolt is inserted in order to engage the block while the end threads of this shank engage an internally threaded bore 190 on the underside of the chuck 178. Hence, by turning the knob one way or the other, the interconnect assembly 48 can be raised or lowered relative to the chuck.

Referring to FIG. 4, it has been described hereinabove how the exemplary interconnect assembly 48 can be used for evaluating the signal conditions in a probe measurement network 21 of the type suitable for probing of planar microelectronic devices. More specifically, the interconnect assembly can be used not just to evaluate the network but also to calibrate the network in accordance with a preferred method that will now be described. The object of this calibration can include normalizing the signal conditions in the network in relation to the device-probing ends so that when measurements of a device are made through these ends, any channel-to-channel differences which are then detected are attributable solely to the characteristics of the device.

To explain this object further, typically at least some of the device-probing ends that correspond to source channels in the network 21 provide different incoming signals to the corresponding input pads of whichever device 24 is under test because each incoming signal is normally transmitted from the port of a different data generating or other sourcing unit within the test instrument 36 and travels along a different transmission path (e.g., through a different conductor in the measurement channel 38 and a different conductor in the probe card 30) to reach the corresponding device-probing end. Accordingly, unless the differences between these incoming signals are somehow compensated for, what is measured at the respective output pads of the device reflects not only the characteristics of the device itself but also these channel-to-channel differences in the incoming signals from the measurement network.

To eliminate the effect of these channel-to-channel differences, in accordance with a preferred calibration method, a reference sensing unit on the test instrument 36, such as a spare logic analyzing unit, is connected to the interconnect assembly 48 through the reference cable or channel 49. Referring to FIG. 7, with respect, for example, to the two source channels of the network that correspond to ends 50a and 50b, the preferred calibration method includes positioning end 50a into contact with the inner probing area 98 and transmitting an incoming signal through the corresponding source channel. This signal enters the transmission structure 106 and, from there, is transmitted through the reference junction 110 and along the reference cable 49 to the logic analyzing unit of the test instrument. This step is then repeated with respect to end 50b. That is, the exemplary assembly 48 is preferably shifted by the automatic positioning mechanism described above so as to position the end 50b into contact with the inner probing area 98 and a second incoming signal is then transmitted through the corresponding source channel. This second signal, like the first signal from end 50a, enters the transmission structure 106 and follows the same evaluation path through the reference junction 110 to the same logic analyzing unit.

It has heretofore been described how the transmission structure 106 provides a transmission line of substantially constant high-frequency transmission characteristic between each end coming into contact with the inner probing area 98 and the reference junction 110. Accordingly, the characteristics of the entire evaluation path between each end and the logic analyzing unit are substantially the same for each signal. This means, in turn, that in the example just given, after the first and second incoming signals are measured at the logic analyzing unit, if a comparison of the resulting measured values indicates that there is a difference between the two signals, then this same difference correspondingly exists in reference to the device-probing ends 50a and 50b. To compensate for this difference, either a computational approach can be used (under which, for example, a suitable numerical offset is added to the readings that are taken through each different source channel) or the probing network 21 itself can be adjusted or altered (this could include, for example, automatically tuning each data generating unit of the test instrument 36 until the incoming signals are substantially identical in reference to the reference sensing unit).

It may be noted that the exemplary calibration procedure just described can be used to correct for the effects of various types of signal differences, including differences in phase delay, differences in signal level, differences in noise level and so on. Of course, the type of parameter that is under evaluation will determine the type of sensing unit required. If, for example, the object is to normalize noise levels in the different channels, a noise meter unit or other like sensing unit should be used instead of a logic analyzing unit.

In the example just given, it was described how the ability of the transmission structure 106 to uniformly transfer signals between the probing area 98 and the reference junction 110 makes it possible to accurately calibrate the source channels of the network and, in particular, makes it possible to adjust the conditions of the incoming signals so that these signals are identical to each other when they reach the device-probing ends of the network. However, because the exemplary interconnect assembly 48 is bidirectionally operable, it is also possible to use the assembly for accurately calibrating the sense channels of the probing network.

Calibration of the sense channels is normally necessary because typically at least some of the sense channels provide conditions for the signals during transmission and measurement that are different than those provided in other ones of the channels. That is, each outgoing signal from a device-under-test, upon entering the corresponding device-probing end of the network, travels along a different transmission path (corresponding to a different conductor in the probe card 30 and a different conductor in the measurement channel 38) and is measured by a different sensing unit in the test instrument 36, which unit has its own individual response characteristic. The object of calibration with respect to the source channels of the network, then, is to compensate for these channel-to-channel transmission and measurement differences so that if identical outgoing signals are presented, for example, to the sense channels by the device-under-test, then this condition is directly and accurately detected by the test instrument.

In accordance with a preferred method of calibrating the sense channels, a reference sourcing unit on the test instrument 36, such as a spare data generating unit, is connected to the interconnect assembly 48 through the reference cable or channel 49. Referring to FIG. 7, with respect, for example, to the two sense channels that correspond to ends 52a and 52b, the preferred calibration method includes positioning end 52a into contact with the inner probing area 98 and transmitting a reference signal from the reference sourcing unit. This outgoing signal is transmitted through the reference junction 110 and then through the source channel corresponding to end 52a until it reaches the corresponding sensing or logic analyzing unit of the test instrument, where it is measured. Next, end 52b is positioned into contact with the inner probing area 98 by the automated positioning mechanism above described. A second reference signal identical to the first is transmitted from the reference sourcing unit and, like the first signal, passes through the reference junction and then through the sense channel corresponding to end 52b until it reaches the respective sensing or logic analyzing unit that corresponds to this second channel, where it is measured.

Because of the ability of the transmission structure 106 to uniformly transfer signals between the reference junction 110 and each end coming into contact with the inner probing area 98, the outgoing signal that is presented to each end 52a and 52b will be substantially identical. Accordingly, if the signal readings of the two sensing units that correspond to ends 52a and 52b are compared and any difference is found to exist between these readings, then this indicates that there are different signal conditions in the two sense channels that correspond to ends 52a and 52b.

Should different signal conditions be detected in the sense channels of the network, in order to calibrate these channels, either computational-type operations can be used (such as the addition of a suitable numerical offset to the readings of each sense channel) or the network can be adjusted or altered until each sense channel responds identically to the same reference signal (this could be achieved, for example, by automatically tuning the sensing unit of each sense channel until each unit responds equally to the signal from the reference sourcing unit).

Although the exemplary construction of the interconnect assembly 48, and its preferred method of use, have now been described, it will be recognized that alternative constructions and uses are possible without departing substantially from the broader principles of the present invention. For example, as noted above, the interconnect assembly, instead of being mounted to a corner of the probe station chuck, could take the form of a wafer-like device that could be readily transported from chuck-to-chuck and which could be held, on each chuck, by the same vacuum lock used for holding wafers. Also, as noted above, different types of reference sourcing and sensing units can be connected in different ways to the reference junction of the interconnect assembly depending on what types of conditions are being evaluated. In addition to these and other variations described above, further variations will be evident to those of ordinary skill in the art from the foregoing description.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. An assembly for use in evaluating signal conditions in a probe measurement network, said probe measurement network being of the type having spaced-apart first and second device-probing ends, said assembly comprising:

(a) a base having an upper face including a dielectric area;

(b) respective first and second conductive planar probing areas located on said upper face in spaced-apart, mutually coplanar relationship to each other, said first and second conductive planar probinq areas being insulated from each other by means of said dielectric area and arranged so that said first and second device-probing ends can be simultaneously placed on said first and second conductive planar probing areas, respectively;

(c) a reference junction; and (d) a high-frequency transmission structure connecting said first and second conductive planar probing areas to said reference junction such that for each position that said device-probing ends can occupy while on the corresponding areas, a transmission line of substantially constant high-frequency transmission characteristic is provided by said transmission structure between said device-probing ends and said reference junction.

2. The assembly of claim 1 adapted for use when said probe measurement network includes at least three device-probing ends in predetermined spaced-apart arrangement, said second conductive planar probing area being arranged relative to said first conductive planar probing area such that when any one of said ends is positioned on said first conductive planar probing area, the other ones of said ends are simultaneously positioned automatically on said second conductive planar probing area.

3. The assembly of claim 1 Wherein said first and second device-probing ends can be simultaneously placed on said first and second conductive planar probing areas, respectively, in at least two positions on said areas.

4. The assembly of claim 1 wherein the size of said first conductive planar probing area approximately corresponds to that of said device-probing end.

5. The assembly of claim 1 further including at least one high-frequency adapter provided adjacent said reference junction, said adapter enabling detachable connection of a reference channel to said reference junction.

6. The assembly of claim 1 further including a high-frequency adapter provided adjacent said reference junction and having spaced-apart first and second conductors, said first and second conductors being connected by said reference junction to said first and second conductive planar probing areas, respectively.

7. The assembly of claim 1 wherein said second conductive planar probing area surrounds said first conductive planar probing area.

8. The assembly of claim 1 wherein said second conductive planar probing area forms a shield about said transmission line that substantially prevents radiation from entering said transmission line from any source adjacent said upper face other than said first device-probing end.

9. The assembly of claim 1 wherein said high-frequency transmission structure is at least partially embedded in said base.

10. The assembly of claim 1 in combination with a support for supporting a device-under-test and further in combination with a positioning mechanism that enables said device-probing ends to be shifted back and forth between a first probing position on the corresponding areas and a second probing position on said device-under-test free of any requirement for removal of said device-under-test from said support.

11. The assembly of claim 10 wherein said support defines an imaginary reference plane and further including an adjustment mechanism enabling adjustable positioning of said base relative to said support so that said probing areas extend in adjustable parallel relationship to said imaginary reference plane.

12. The assembly of claim 10 wherein said base is mounted in adjoining relationship to said support.

* * * * *

UNITED STATES PATENT AND TRADEMARK OFFICE
CERTIFICATE OF CORRECTION

PATENT NO. : 5,561,377

DATED : October 1, 1996

INVENTOR(S) : Eric W. Strid et al.

It is certified that error appears in the above-indentified patent and that said Letters Patent is hereby corrected as shown below:

Col. 6, line 24    Change "solitar" to --solitary--

Col. 20, line 65   Change "502b" to --50b--.

Signed and Sealed this

Fifteenth Day of April, 1997

Attest:

BRUCE LEHMAN

Attesting Officer    Commissioner of Patents and Trademarks